(12) United States Patent
Mabuchi

(10) Patent No.: US 9,989,577 B2
(45) Date of Patent: Jun. 5, 2018

(54) CONTINUITY INSPECTION DEVICE

(71) Applicant: YAZAKI CORPORATION, Tokyo (JP)

(72) Inventor: Miyoshi Mabuchi, Makinohara (JP)

(73) Assignee: YAZAKI CORPORATION, Minato-ku, Tokyo (JP)

(*) Notice: Subject to any disclaimer, the term of this patent is extended or adjusted under 35 U.S.C. 154(b) by 192 days.

(21) Appl. No.: 14/710,021

(22) Filed: May 12, 2015

(65) Prior Publication Data

US 2015/0241502 A1   Aug. 27, 2015

Related U.S. Application Data

(63) Continuation of application No. PCT/JP2013/077943, filed on Oct. 15, 2013.

(30) Foreign Application Priority Data

Nov. 14, 2012 (JP) ................................ 2012-250175

(51) Int. Cl.
| | |
|---|---|
| *G01R 31/00* | (2006.01) |
| *G01R 31/02* | (2006.01) |
| *G01R 31/04* | (2006.01) |

(52) U.S. Cl.
CPC ......... *G01R 31/026* (2013.01); *G01R 31/021* (2013.01); *G01R 31/045* (2013.01)

(58) Field of Classification Search
CPC ... G01R 31/026; G01R 31/021; G01R 31/045
See application file for complete search history.

(56) References Cited

U.S. PATENT DOCUMENTS

| | | | | |
|---|---|---|---|---|
| 4,878,017 A | * | 10/1989 | Williams | ............. G01R 15/165 324/109 |
| 6,456,198 B1 | * | 9/2002 | Kato | ...................... G08B 13/26 256/10 |

(Continued)

FOREIGN PATENT DOCUMENTS

| | | |
|---|---|---|
| CN | 101533057 A | 9/2009 |
| JP | 52-6989 A | 1/1977 |

(Continued)

OTHER PUBLICATIONS

Communication dated Aug. 2, 2016, issued by the State Intellectual Property Office of the P.R.C. in corresponding Chinese Application No. 201380059654.5.

(Continued)

*Primary Examiner* — Julian Huffman
*Assistant Examiner* — Michael Konczal
(74) *Attorney, Agent, or Firm* — Sughrue Mion, PLLC

(57) ABSTRACT

In this continuity inspection device, a reference electrode plate held at ground potential is disposed along an intermediate portion of electric wires to be inspected for continuity, and a discharge path (positive charge leaking path) for static electricity charged on the electric wires after the continuity inspection is secured by the reference electrode plate. Thus, accumulation of static electricity after the continuity inspection on electric wires is avoided. Moreover, the electric potential of the static electricity charged on the electric wires by application of voltage to power supplying probes is measured by measuring equipment as the absolute potential with respect to the ground potential of the reference electrode plate through the surface potential of the terminals of the electric wires. Thus, the electric potential of the static electricity of the electric wires is accurately measured with- (Continued)

out being affected by cross talk due to stray capacitance between the electric wires.

12 Claims, 3 Drawing Sheets

(56) References Cited

U.S. PATENT DOCUMENTS

| | | | |
|---|---|---|---|
| 6,507,204 B1 | 1/2003 | Kanamaru et al. | |
| 7,123,022 B2* | 10/2006 | Parker | G01R 31/026 324/538 |
| 7,489,135 B2* | 2/2009 | Ichimura | G01R 29/12 257/314 |
| 2007/0059965 A1* | 3/2007 | Scherschel | G01R 29/24 439/331 |
| 2009/0067106 A1* | 3/2009 | Kim | H02H 9/046 361/56 |
| 2010/0118457 A1* | 5/2010 | Kwak | H01L 27/0262 361/56 |

FOREIGN PATENT DOCUMENTS

| | | |
|---|---|---|
| JP | 7-280864 A | 10/1995 |
| JP | 2002-14135 A | 1/2002 |
| JP | 2002014135 A * | 1/2002 |
| JP | 2009-103683 A | 5/2009 |

OTHER PUBLICATIONS

Communication dated Aug. 9, 2016, issued by the Japan Patent Office in corresponding Japanese Application No. 2012-250175.

Communication dated Jun. 30, 2015, issued by the Swiss Federal Institute of Intellectual Property in counterpart Application No. 0611/15.

International Search Report of PCT/JP2013/077943, dated Jan. 28, 2014. [PCT/ISA/210].

Communication dated Feb. 20, 2017, issued by the State Intellectual Property Office of the P.R.C. in corresponding Chinese Application No. 201380059654.5.

* cited by examiner

CONTINUITY INSPECTION DEVICE

CROSS REFERENCE TO RELATED APPLICATION

This application is a Continuation of PCT Application No. PCT/JP2013/077943, filed on Oct. 15, 2013, and claims the priority of Japanese Patent Application No. 2012-250175, filed on Nov. 14, 2012, the content of both of which is incorporated herein by reference.

BACKGROUND

1. Technical Field

The present invention relates to a continuity inspection device of an electric wire such as a wire harness in which terminals of a connector are connected to both ends of the electric wire.

2. Related Art

In the case of an electric wire such as a wire harness in which terminals of a connector are connected to both ends of the electric wire, a continuity inspection is conducted to detect breaking of the electric wire and a connection failure of the terminals. The continuity inspection is conducted by measuring electric potential appearing on the terminal corresponding to the connector on one end of the electric wire in a state where inspection voltage is applied to the terminal of the connector to be measured from the inspection device in the other end of the electric wire.

The continuity inspection is conducted in a state where a connector of the inspection device is fitted to one or both of the connectors of the electric wire. However, at this time since the terminal of the connector of the inspection device is inserted into and pulled out from the terminal of the connector, inserting and pulling out operations are repeated when the continuity inspection is conducted, and there is a possibility that the terminal is deformed.

Hence, it is proposed that contacts of an inspection device are opposed to terminals of connectors of both ends of an electric wire in a non-contact state, electric discharge of such a degree that electric arc is not generated is generated between one of the contacts and the terminal of one end of the electric wire by pulse voltage applied from the inspection device, and static electricity is generated in the electric wire.

According to this proposal, if a continuity state of the electric wire is normal, since electric discharge of such a degree that electric arc is not generated is also generated between the other contact and the terminal of the other end of the electric wire, if the terminal potential of the other end of the electric wire is measured by the inspection device through potential of the other contact, it is possible to inspect the continuity state of the electric wire (Patent Literature 1 for example).

CITATION LIST

Patent Literature

Patent Literature 1: Japanese Unexamined Patent Application Publication No. H 07-280864

SUMMARY

In the proposed continuity inspection, the static electricity generated in the electric wire is extremely small. Therefore, to measure potential of the other end terminal of the electric wire by the static electricity, it is necessary to use a surface electrometer having high internal impedance. However, if the internal impedance of the surface electrometer is high, static electricity of the electric wire does not easily leak through the surface electrometer after the continuity inspection. Hence, the electric wire after the inspection keeps accumulating the static electricity.

The present invention has been accomplished in view of the above circumstances, and it is an object of the present invention to provide a continuity inspection device capable of measuring potential of static electricity of an electric wire which is electric-charged by applying voltage to one of probes opposed to a terminal of one end of the electric wire in a non-contact state through the other probe opposed to a terminal of the other end of the electric wire in a non-contact state, and capable of making easy to leak static electricity from the electric wire after an inspection when a continuity state of the electric wire is inspected based on a result of the measurement.

To achieve the above object, a continuity inspection device of first characteristics of the present invention for inspecting a continuity state of an electric wire having a first terminal at one end side and a second terminal at the other end side, includes: a first probe opposed to the first terminal in a non-contact state; a second probe opposed to the second terminal in a non-contact state; and a reference electrode plate placed along an intermediate portion of the electric wire. Voltage is applied to the first probe, and in a state where potential of the reference electrode plate is fixed to potential lower than that of the voltage applied to the first probe, surface potential of the second terminal is measured through the second probe, and the continuity state of the electric wire is inspected based on a result of the measurement.

According to this configuration, if voltage is applied to the first probe opposed to the first terminal of one end of the electric wire, electron absorbed by the first terminal of the one end of the electric wire is discharged into air by positive potential of the first probe, and the electron moves to the first probe. Then, the one end of the electric wire which is positively charged is electrostatically charged and at the same time, the entire electric wire is electrostatically charged, and potential of the entire electric wire becomes the same as that of the one end of the electric wire.

Therefore, if surface potential of the second terminal of the other end of the electric wire is measured through the second probe and it is determined whether the surface potential is potential corresponding to voltage applied to the first probe, it is possible to inspect a continuity state of the electric wire.

Electron absorbed by the reference electrode plate having potential lower than that of static electricity charged in an intermediate portion of the electric wire is discharged into air from the reference electrode plate between the reference electrode plate placed along the intermediate portion of the electrostatically charged electric wire, and the electron moves to the intermediate portion of the electric wire. Then, a moving path of electron which reaches the first probe from the reference electrode plate through the intermediate portion and the one end of the electric wire is formed, current flows through the moving path in a direction opposite from the electron, and static electricity (positive charge) charged in the electric wire leaks through a path extending along the flow of the current.

Hence, even if a path through which static electricity leaks from the electric wire after the continuity inspection cannot be secured on the path including the surface electrometer having high internal impedance, it is possible to secure a leakage path of static electricity in the path extending through the reference electrode plate from the intermediate portion of the electric wire, and to prevent a, case where the electric wire after the continuity inspection keeps accumulating static electricity.

Further, it is possible to measure, by the surface electrometer, potential of static electricity generated in the first terminal of the one end of the electric wire by applying voltage to the first probe as absolute potential with respect to fixed potential of the reference electrode plate. Therefore, it is possible to precisely measure potential of static electricity of the electric wire and to reflect the measured potential to the inspection of the continuity state without receiving influence of cross talk caused by floating capacitance between the electric wires.

A distance between the terminals of the electric wire and the first and second probes, and a distance of the intermediate portion of the electric wire and the reference electrode plate are set to such a degree that air discharge which does not generate electric arc is generated between both of them sandwiching these distances.

A continuity inspection device of second characteristics of the present invention for inspecting continuity states of a plurality of electric wires each having a first terminal at one end side and a second terminal at the other end side, includes: a plurality of first probes opposed to the first terminal in a non-contact state; a plurality of second probes opposed to the second terminal in a non-contact state; and a reference electrode plate placed along intermediate portions of the plurality of electric wires. Voltage is applied to one of the first probes, and in a state where potential of the reference electrode plate is fixed to potential lower than flint of the voltage applied to the first probe, surface potential of one of the second terminals or one or more second terminals including the second terminal of the electric wire corresponding to at least one of the first probes is measured through the second probe, and the continuity states of the plurality of electric wires are inspected based on a result of the measurement.

According to this configuration, appearance of influence of cross talk with the other electric wire with respect to the surface potential appearing on the second terminal which is the other end of each of the electric wires is eliminated by existence of the reference electrode plate, as described above.

Therefore, when the first terminal which is the one end of a certain electric wire is electrostatically charged, if only surface potential of the second terminal which is the other end of that electric wire has potential corresponding to voltage applied to the first probe, an inspection result shows that this electric wire is in the continuity state.

When the first terminal which is the one end of a certain electric wire is electrostatically charged, in the plurality of electric wires including this electric wire, if surface potentials of the second terminals which are the other ends are the same potentials (not potential of the reference electrode plate), an inspection result shows that short circuit between the electric wires or the terminals is generated between the certain electric wire and other electric wire, or a subject of the continuity inspection is a connection circuit which connects the plurality of electric wires to the other end of the certain electric wire.

Further, when a first terminal of one end of a certain electric wire is electrostatically charged, if all of surface potentials of the second terminals of the other ends of all of the electric wires are ground potentials, an inspection result shows the certain electric wire is broken or connection failure is generated between the certain electric wire and terminals of both ends thereof.

When a continuity inspection of a wire harness composed of a plurality of electric wires is conducted, various continuity states can individually be obtained as inspection results.

According to the continuity inspection device having the characteristics of the present invention, it is possible to measure potential of static electricity of an electric wire charged by applying voltage to one of probes which is opposed to a terminal of one end of the electric wire in a non-contact state through the other probe which is opposed to a terminal of the other end of the electric wire in a non-contact state, and when a continuity state of the electric wire is inspected based on a result of the measurement, it is possible to make it easy to leak static electricity from the inspected electric wire.

DETAILED DESCRIPTION

Figure 1:
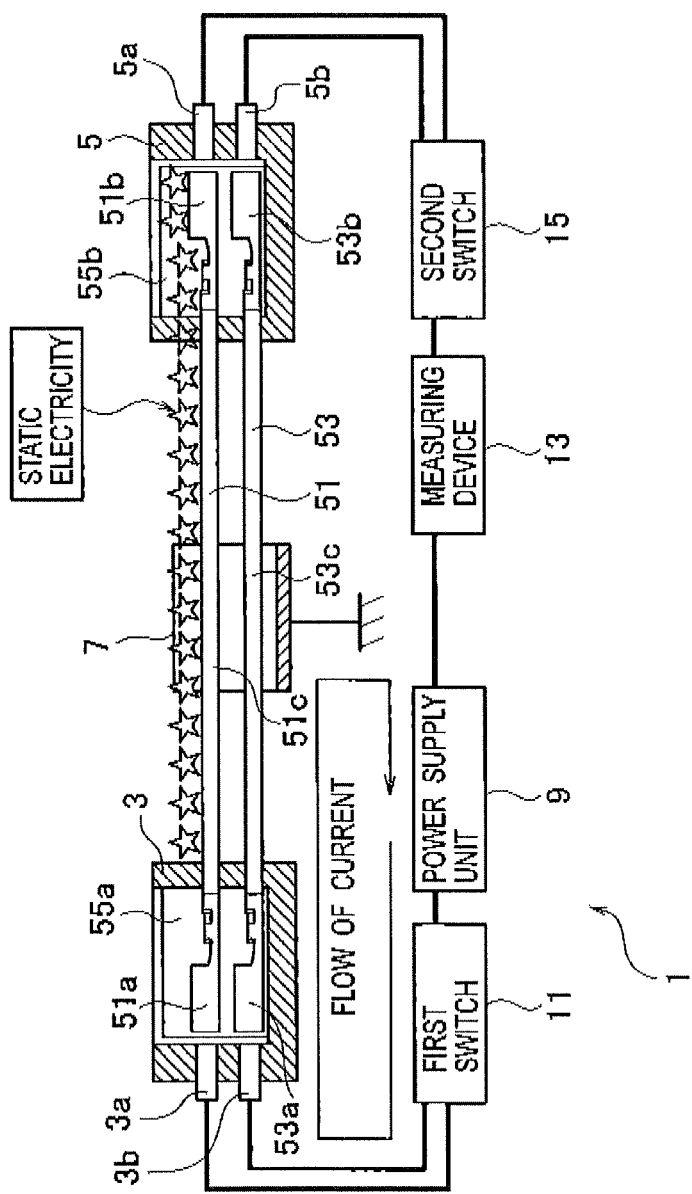
FIG. 1 is an explanatory diagram illustrating a principle configuration of a continuity inspection device according to an embodiment.

An embodiment of the present invention will be described with reference to FIGS. 1 to 4.

A continuity inspection device 1 according to the embodiment is for conducting a continuity inspection of electric wires 51 and 53 such as a wire harness (not shown) of a vehicle. In this embodiment, first terminals 51a and 53a are connected to one ends of the electric wires 51 and 53 (of core wires (not shown) covered with insulating films (not shown)), and second terminals 51b and 53b are connected to the other ends of the electric wires 51 and 53. The first terminals 51a and 53a which are one ends of the electric wires 51 and 53 are accommodated in each of first connectors 55a. The second terminals 51b and 53b which are the other ends are accommodated in each of second connectors 55b.

The continuity inspection device 1 also includes power feeding-side connector receivers 3 in which the first connectors 55a are accommodated, inspecting-side connector receivers 5 in which the second connectors 55b are accommodated, and a reference electrode plate 7 placed along intermediate portions 51c and 53c of the electric wires 51 and 53. The continuity inspection device 1 also includes a power supply unit 9 for energizing the electric wires 51 and 53 to be inspected, and a first switch 11 for switching between the electric wires 51 and 53 to be energized. Further, the continuity inspection device 1 also includes a measuring device 13 for measuring surface potentials of the second terminals 51b and 53b which are the other ends of the electric wires 51 and 53 to be inspected, and a second switch 15 for switching between the second terminals 51b and 53b whose surface potentials are to be measure.

Each of the power feeding-side connector receivers 3 includes two power feeding probes 3a and 3b (first probes). Tip end surfaces of the power feeding probes 3a and 3b are opposed to tip ends of the first terminals 51a and 53a of the first connector 55a accommodated in each of the power feeding-side connector receivers 3 in a non-contact state.

The power feeding probes 3a and 3b are connected to the power supply unit 9 through the first switch 11. Voltage of predetermined magnitude is applied from the power supply unit 9 to the power feeding probes 3a and 3b which are connected to the power supply unit 9 through the first switch 11. The power feeding probes 3a and 3b to which the voltage of the predetermined magnitude is applied generates air discharge which does not generate electric arc between the first terminals 51a and 53a of the opposed first connector 55a, and the electric wires 51 and 53 connected to the first terminals 51a and 53a are electrostatically charged.

More specifically, if voltage is applied to the power feeding probes 3a and 3b which are opposed to the first terminals 51a and 53a which are the one ends of the electric wires 51 and 53, electron absorbed by the first terminals 51a and 53a due to positive potentials of the power feeding probes 3a and 3b is discharged into air from the first terminals 51a and 53a and moves to the power feeding probes 3a and 3b. Then, the one ends of the electric wires 51 and 53 in which the positive potentials are accumulated are electrostatically charged and with this state, the entire electric wires 51 and 53 are electrostatically charged, and the entire electric wires 51 and 53 have the same potentials.

Each of the inspecting-side connector receivers 5 includes two inspection probes 5a and 5b (second probes). Tip end surfaces of the inspection probes 5a and 5b are opposed to tip ends of the second terminals 51b and 53b of the second connector 55b accommodated in each of the inspecting-side connector receivers 5 in a non-contact state.

The inspection probes 5a and 5b are connected to the measuring device 13 through the second switch 15. The measuring device 13 connected to the inspection probes 5a and 5b through the second switch 15 measures surface potentials of the second terminals 51b and 53b opposed to the inspection probes 5a and 5b by a conventionally known surface electrometer. Although the measuring device 13 is grounded in terms of a circuit, since the measuring device 13 has high internal impedance, a current path extending from the inspection probes 5a and 5b to the ground through the second switch 15 and the measuring device 13 is not substantially formed.

The reference electrode plate 7 is made of conducting body such as metal, an upper portion and a side portion of the reference electrode plate 7 are opened, and a cross section thereof is formed into U-shape. The reference electrode plate 7 is grounded and has ground potential (0 V). An inner wall and a bottom wall of the reference electrode plate 7 are placed along the intermediate portions 51c and 53c of the electric wires 51 and 53.

Electron absorbed by a portion between the reference electrode plate 7 and the intermediate portions 51c and 53c of the electric wires 51 and 53 which is opposed to the reference electrode plate 7 is discharged into air from the reference electrode plate 7 by the positive potential of the electrostatically charged intermediate portions 51c and 53c, and the electron moves to the intermediate portions 51c and 53c of the electric wires 51 and 53.

Between the power feeding probes 3a and 3b and the first terminals 51a and 53a as the one ends which are opposed to the power feeding probes 3a and 3b, current flows from the power feeding probes 3a and 3b toward the first terminals 51a and 53a in a direction opposite from the moving direction of the electron. Between the intermediate portions 51c and 53c of the electric wires 51 and 53 and the reference electrode plate 7 placed at a predetermined distance from the intermediate portions 51c and 53c, current flows from the intermediate portions 51c and 53c of the electric wires 51 and 53 toward the reference electrode plate 7 in a direction opposite from the moving direction of electron.

Therefore, as shown by a right-hand turning arrow in FIG. 1, current flowing toward the power feeding probes 3a and 3b to which voltage of predetermined magnitude is applied from the power supply unit 9 through the first switch 11 flows from the first terminals 51a and 53a toward the ground through the reference electrode plate 7 and the intermediate portions 51c and 53c of the electric wires 51 and 53.

A distance between the first terminals 51a and 53a and the power feeding probes 3a and 3b, a distance between the second terminals 51b and 53b and the inspection probes 5a and 5b, and a distance between the reference electrode plate 7 and the intermediate portions 51c and 53c (core wires therein) of the electric wires 51 and 53 are set to such a degree that air discharge which does not generate electric arc is generated therebetween sandwiching these distances.

In FIG. 1, the two power feeding probes 3a and 3b and the two inspection probes 5a and 5b are illustrated in the power feeding-side and inspecting-side connector receivers 3 and 5 for facilitating visibility. However, in the reality, probes as many as terminals of the connectors 55a and 55b accommodated in the power feeding-side and inspecting-side connector receivers 3 and 5 are provided in the power feeding-side and inspecting-side connector receivers 3 and 5, respectively.

Figure 2:
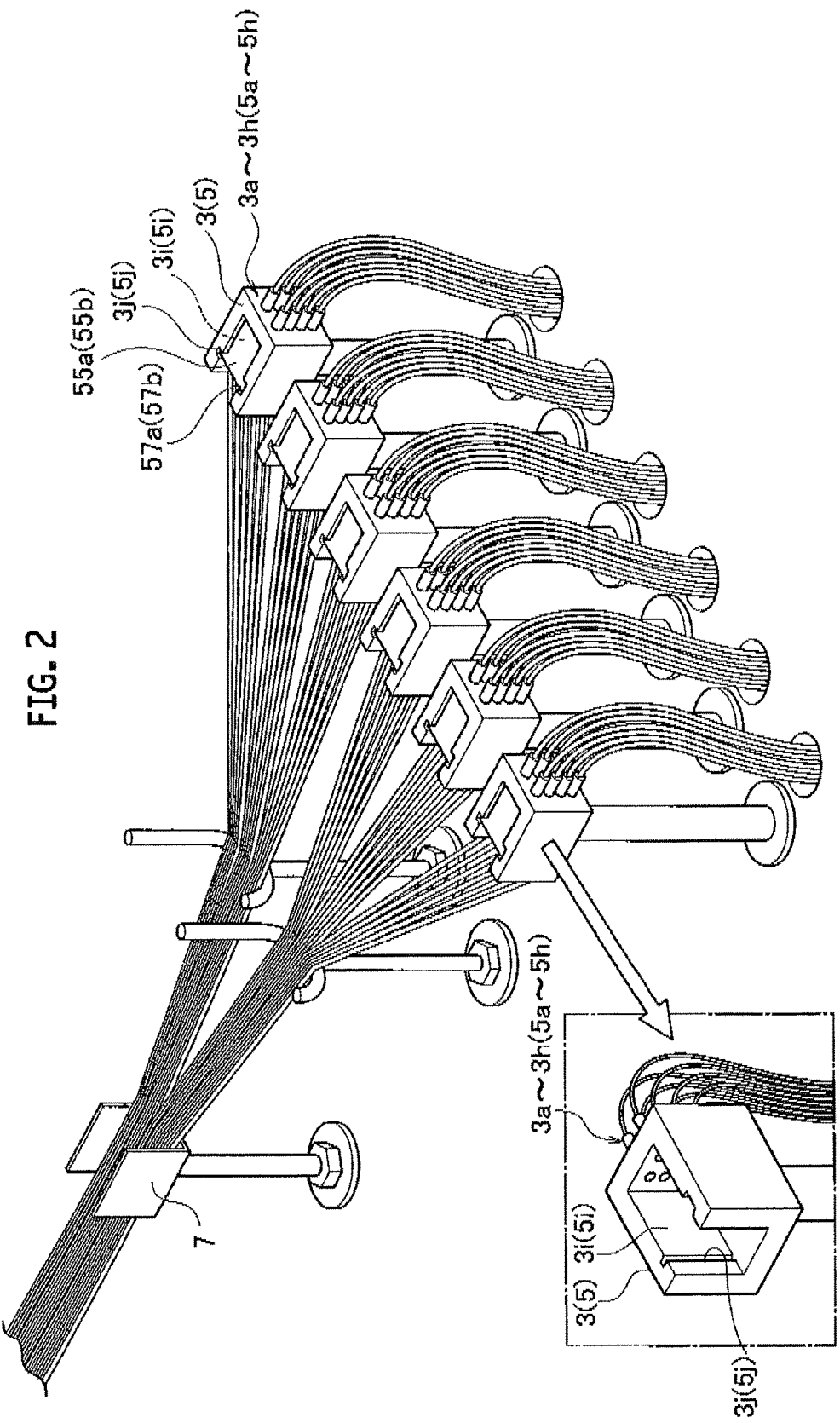
FIG. 2 is a perspective view illustrating essential portions of the continuity inspection device illustrated in FIG. 1.

For example, in an example illustrated in the perspective view in FIG. 2, the power feeding-side and inspecting-side connector receivers 3 and 5 are respectively provided with eight power feeding probes 3a to 3h and eight inspecting-side probes 5a to 5h as many as the terminals of the connectors 55a and 55b. In the example illustrated in FIG. 2, six power feeding-side connector receivers 3 (inspecting-side connector receivers 5) commonly have one reference electrode plate 7.

Slits 3j and 5j are formed in inner walls 3i and 5i of the power feeding-side and inspecting-side connector receivers 3 and 5. In a state where the connectors 55a and 55b are inserted into the connector receivers 3 and 5 from above, flanges 57a and 57b of the connectors 55a and 55b are inserted into the slits 3j and 5j. This configuration prevents the connectors 55a and 55b accommodated in the connector receivers 3 and 5 from being pulled out.

Next, operation of the continuity inspection device 1 according to the embodiment will be described. First, one of the power feeding probes 3a and 3b to which voltage is applied by the power supply unit 9 is selected (switched) by the first switch 11. Assume that the power feeding probe 3a is selected (switched) here. Voltage is applied from the power supply unit 9 to the power feeding probe 3a.

Then, electron moves to the power feeding probe 3a from the first terminal 51a opposed to the power feeding probe 3a and the entire electric wire 51 having the first terminal 51a is electrostatically charged. Potential of this static electricity is potential corresponding to electrostatic capacity between the intermediate portion 51c of the electric wire 51 and the reference electrode plate 7 placed along the intermediate portion 51c, i.e., absolute potential with respect to the ground potential (0 V) of the reference electrode plate 7. The measuring device 13 is connected to the inspection probe 5a by the second switch 15, and the measuring device 13 measures surface potential of the second terminal 51b which is the other end of the electric wire 51 opposed to the inspection probe 5a.

At this time, since the internal impedance of the measuring device 13 is high, static electricity of the electric wire 51 is not discharged to the ground through the inspection probe 5a, the second switch 15 and the measuring device 13, and the electric wire 51 is kept electrostatically charged.

When the first terminal of one end of a certain electric wire is electrostatically charged, if surface potentials of second terminals on the other ends in a plurality of electric wires including the certain electric wire are the same (but not ground potential), an inspection result shows that between the certain electric wire and other electric wires, short circuit is generated between the electric wires or between the terminals, or a subject of the continuity inspection is a connection circuit in which the plurality of electric wires are connected to the other end of the certain electric wire.

If surface potential of the second terminal 51b of the electric wire 51 measured by the measuring device 13 is potential corresponding to voltage applied to the power feeding probe 3a by the power supply unit 9, an inspection result shows that continuity states of the electric wire 51, the first terminal 51a and the second terminal 51b are normal. If surface potential of the second terminal 51b is ground potential (0 V), an inspection result shows that the electric wire 51 is broken or connection failure is generated between the electric wire 51, the first terminal 51a and the second terminal 51b.

While the power supply unit 9 applies voltage to the power feeding probe 3a, a subject of measurement of surface potential by the measuring device 13 may be switched from the second terminal 51b of the electric wire 51 to the second terminal 53b of the electric wire 53 by the second switch 15. When the surface potentials of the second terminals 51b and 53b of the electric wires 51 and 53 are measured and the surface potentials of the measured two second terminals 51b and 53b are the same (but not ground potential), an inspection result shows that between the electric wires 51 and 53, short circuit is generated between the electric wires 51 and 53 or between the terminals 51a, 53a, 51b and 53b, or a subject of the continuity inspection is a connection circuit in which the plurality of electric wires are connected to the other end of the certain electric wire.

Figure 3:
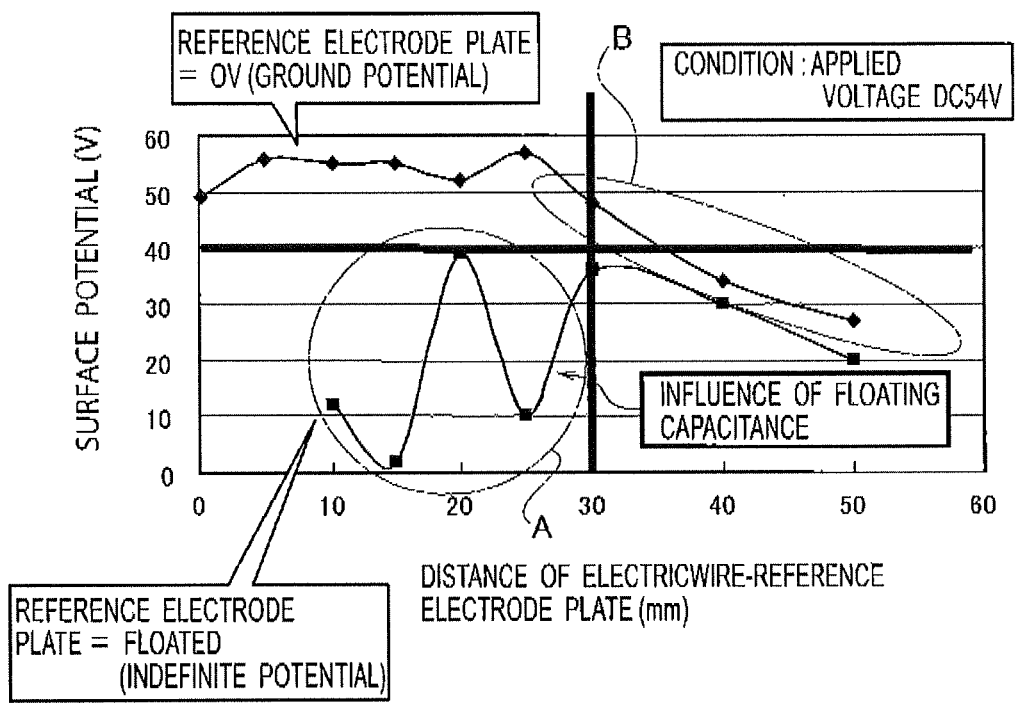
FIG. 3 is a graph in which surface potential of a terminal of the other end of an electric wire measured by a measuring device illustrated in FIG. 1 is divided into a case where a reference electrode plate is brought into ground potential and a case where the reference electrode plate is floated from ground potential, and these cases are plotted based on distances between the reference electrode plate and an intermediate portion of the electric wire.

FIG. 3 is a graph in which surface potential of a second terminal of the other end of an electric wire measured by a measuring device illustrated in FIG. 1 is divided into a case where the reference electrode plate is brought into ground potential and a case where the reference electrode plate is floated from ground potential, and these cases are plotted based on distances between the reference electrode plate and an intermediate portion of the electric wire.

When potential of the electric wire 51 which is electrostatically charged by applying voltage to the power feeding probe 3a is measured by the measuring device 13 based on surface potential of the second terminal 51b for example, if the reference electrode plate 7 is brought into ground potential, potential of static electricity becomes absolute potential with respect to ground potential (0 V) of the reference electrode plate 7 which is placed along the intermediate portion 51c of the electric wire 51 as described above. Hence, influence of floating capacitance between the electric wire 51 and the electric wire 53 appears on surface potential of the second terminal 51b of the electric wire 51 measured by the measuring device 13, and a value which is about the same as voltage applied to the power feeding probe 3a by the power supply unit 9 is stably measured.

On the other hand, if the reference electrode plate 7 is not grounded and is floated, potential of static electricity charged in the electric wire 51 is irregularly varied due to influence of the floating capacitance generated between the electric wire 51 and the electric wire 53. Therefore, surface potential of the second terminal 51b of the electric wire 51 measured by the measuring device 13 becomes an unstable value. That is, as shown in a region A in FIG. 3, since potential of the reference electrode plate 7 is unstable, the measured potential is not stabilized.

Even if the reference electrode plate 7 is brought into ground potential (0 V), if a distance between the reference electrode plate 7 and the intermediate portions 51c and 53c of the electric wires 51 and 53 becomes 30 mm or more, a degree in which potential of static electricity of the electric wire 51 becomes absolute potential with respect to the ground potential (0 V) is weakened by the existence of the reference electrode plate 7. Therefore, surface potential of the second terminal 51b of the electric wire 51 measured by the measuring device 13 is varied to a value lower than voltage applied to the power feeding probes 3a and 3b. That is, as shown by a region B in FIG. 3, if a distance between the reference electrode plate 7 and the electric wires 51 and 53 is long, measured potential is not stabilized.

Figure 4:
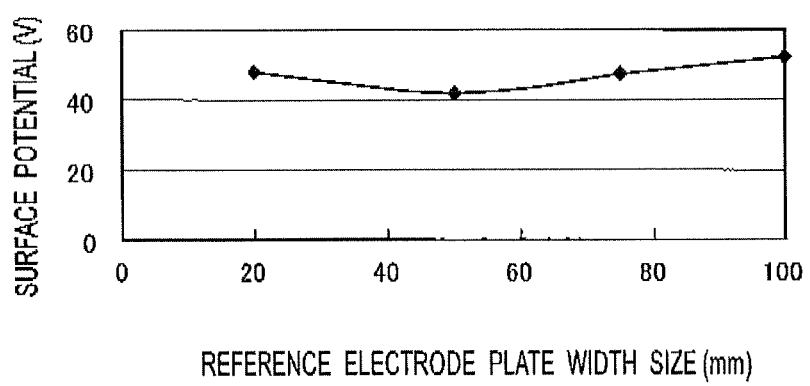
FIG. 4 is a graph showing a relation between a size of the reference electrode plate and surface potential of the terminal of the other end of the electric wire measured by the measuring device illustrated in FIG. 1.

As shown in a graph in FIG. 4, potentials of static electricity of the intermediate portions 51c and 53c of the electric wires 51 and 53 becomes absolute potential with respect to the ground potential (0 V) of the reference electrode plate 7 irrespective of a size (width size) of the reference electrode plate 7 in an extending direction of the electric wires 51 and 53. That is, even if the reference electrode plate 7 is wider than a given area measured potential is not varied. Therefore, an appropriate width size may be employed for the reference electrode plate 7 in accordance with a space of a place where the continuity inspection device 1 is installed.

If the measurement of surface potentials of the second terminals 51b and 53b of the electric wires 51 and 53 by the measuring device 13 is completed and application of voltage to the power feeding probes 3a and 3b by the power supply unit 9 is stopped, electron is discharged and moved from the reference electrode plate 7 to the intermediate portions 51c and 53c of the electrostatically charged electric wires 51 and 53, and static electricity of the electric wires 51 and 53 is discharged from the intermediate portions 51c and 53c toward the ground through the reference electrode plate 7. Therefore, after the continuity inspection, the electric wires 51 and 53 after the connectors 55a and 55b are detached from the power feeding-side and inspecting-side connector receivers 3 and 5 are not electrostatically charged.

According to the continuity inspection device 1 of the embodiment, the reference electrode plate 7 which is brought into the ground potential (0 V) is placed along the intermediate portions 51c and 53c of the electric wires 51 and 53 which are subjects of the continuity inspection, and a discharge path (leaking path of positive charge) of static electricity charged in the electric wires 51 and 53 after the continuity inspection is secured by the reference electrode plate 7.

Hence, even if a path through which static electricity leaks from the electric wires 51 and 53 after the continuity inspection cannot be secured by a path including the measuring device 13 having high internal impedance, the leaking path of static electricity can be secured by the path extending from the intermediate portions 51c and 53c of the electric wires 51 and 53 through the reference electrode plate 7, and it is possible to prevent a case where the electric wires 51 and 53 after the continuity inspection keep accumulating static electricity.

Further, the measuring device 13 can measure potential of static electricity charged in the electric wires 51 and 53 by applying voltage to the power feeding probes 3a and 3b as absolute potential with respect to ground potential (0 V) of the reference electrode plate 7. Therefore, it is possible to precisely measure the potential of static electricity of the electric wires 51 and 53 and can reflect the measured potential to the inspection of the continuity state without receiving influence of cross talk caused by floating capacitance between the electric wires 51 and 53.

Although the reference electrode plate 7 is connected to the ground and is brought into the ground potential (0 V) in the continuity inspection device 1 of the embodiment, if the potential of the reference electrode plate 7 is lower than that of static electricity of the electric wires 51 and 53, the potential of the reference electrode plate 7 may be fixed potential other than the ground potential (0 V).

What is claimed is:

1. A continuity inspection device for inspecting a continuity state of an electric wire having a first terminal at one end side and a second terminal at the other end side, comprising:
    a first probe opposed to the first terminal in a non-contact state;
    a second probe opposed to the second terminal in a non-contact state;
    a reference electrode plate placed along an intermediate portion of the electric wire;
    a power supply unit configured to apply voltage to the first probe so as to charge static electricity on the wire; and
    a measuring device configured to measure surface potential of the second terminal through the second probe while keeping the electric wire charged in a state where potential of the reference electrode plate is fixed to potential lower than that of the voltage applied to the probe,
    the continuity state of the electric wire being inspected based on a result of the measurement.

2. The continuity inspection device according to claim 1, wherein potential of the reference electrode plate is ground potential.

3. The continuity inspection device according to claim 1, wherein the reference electrode plate is formed into a U-shape.

4. The continuity inspection device according to claim 3, wherein the reference electrode plate includes a bottom wall and a pair of side walls opposing each other.

5. The continuity inspection device according to claim 4, wherein a distance between the electric wire in the reference electrode plate and the reference electrode plate is less than 30 mm.

6. The continuity inspection device according to claim 1, wherein a length of the reference electrode plate along an axis direction of the electric wire is less than a length of the electric wire.

7. A continuity inspection device for inspecting continuity states of a plurality of electric wires each having a first terminal at one end side and a second terminal at the other end side, comprising:
    a plurality of first probes opposed to the first terminals in a non-contact state;
    a plurality of second probes opposed to the second terminals in a non-contact state;
    a reference electrode plate placed along intermediate portions of the plurality of electric wires,
    a power supply unit configured to apply voltage to one of the first probes so as to charge static electricity on the electric wire; and
    a measuring device configured to measure surface potential of one of the second terminals or one or more second terminals including the second terminal of the electric wire corresponding to at least one of the first probes is measured through one of the second probes while keeping the electric wire charged,
    the continuity states of the plurality of electric wires being inspected based on a result of the measurement.

8. The continuity inspection device according to claim 7, wherein potential of the reference electrode plate is ground potential.

9. The continuity inspection device according to claim 7, wherein the reference electrode plate is formed into a U-shape.

10. The continuity inspection device according to claim 9, wherein the reference electrode plate includes a bottom wall and a pair of side walls opposing each other.

11. The continuity inspection device according to claim 10, wherein a distance between the plurality of electric wires in the reference electrode plate and the reference electrode plate is less than 30 mm.

12. The continuity inspection device according to claim 7, wherein a length of the reference electrode plate along an axis direction of the plurality of electric wires is less than a length of the plurality of electric wires.

* * * * *